US011797196B2

United States Patent
Hong et al.

(10) Patent No.: US 11,797,196 B2
(45) Date of Patent: *Oct. 24, 2023

(54) SOLID STATE DRIVE (SSD) AND OPERATING METHOD

(71) Applicant: SAMSUNG ELECTRONICS CO., LTD., Suwon-si (KR)

(72) Inventors: Jung-hyun Hong, Hwaseong-si (KR); Sueng-chul Ryu, Hwaseong-si (KR); Han-min Cho, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/961,048

(22) Filed: Oct. 6, 2022

(65) Prior Publication Data
US 2023/0035828 A1 Feb. 2, 2023

Related U.S. Application Data

(63) Continuation of application No. 16/508,711, filed on Jul. 11, 2019, now Pat. No. 11,494,094.

(30) Foreign Application Priority Data

Dec. 7, 2018 (KR) .................. 10-2018-0157475

(51) Int. Cl.
G06F 3/06 (2006.01)
G11C 16/10 (2006.01)
G11C 16/26 (2006.01)
G11C 16/32 (2006.01)
G11C 16/04 (2006.01)

(52) U.S. Cl.
CPC .......... *G06F 3/0625* (2013.01); *G06F 3/0653* (2013.01); *G06F 3/0659* (2013.01); *G06F 3/0679* (2013.01); *G11C 16/10* (2013.01); *G11C 16/26* (2013.01); *G11C 16/32* (2013.01); *G11C 16/0483* (2013.01)

(58) Field of Classification Search
None
See application file for complete search history.

(56) References Cited

U.S. PATENT DOCUMENTS

| 5,619,452 A | 4/1997 | Miyauchi |
| 7,395,398 B2 | 7/2008 | Kim |
| 7,498,835 B1 | 3/2009 | Rahman et al. |
| 7,903,116 B1 | 3/2011 | Klock et al. |

(Continued)

FOREIGN PATENT DOCUMENTS

| KR | 10-0546362 B1 | 1/2006 |
| KR | 10-2011-0037492 A | 4/2011 |
| KR | 10-2013-0085736 A | 7/2013 |

*Primary Examiner* — Rocio Del Mar Perez-Velez
*Assistant Examiner* — Marwan Ayash
(74) *Attorney, Agent, or Firm* — Lee IP Law, P.C.

(57) ABSTRACT

A storage system and an operating method thereof are disclosed. The storage system includes a nonvolatile memory that stores data; a computing device to perform data processing on input data provided from the nonvolatile memory or a host outside the storage system; and a controller to control a writing operation and a reading operation of the nonvolatile memory, monitor an operating state of the computing device while the computing device is performing the data processing, and dynamically manage power of the computing device according to a monitoring result.

15 Claims, 22 Drawing Sheets

(56) References Cited

U.S. PATENT DOCUMENTS

| | | |
|---|---|---|
| 8,448,002 B2 | 5/2013 | Bulusu et al. |
| 8,650,422 B1 | 2/2014 | Goolsby |
| 9,104,423 B2 | 8/2015 | Ahmad et al. |
| 9,436,243 B2 | 9/2016 | Zhao et al. |
| 9,619,377 B2 | 4/2017 | Tripathi et al. |
| 9,690,518 B2 | 6/2017 | Shinaar et al. |
| 9,727,267 B1 | 8/2017 | Sebastian et al. |
| 9,760,311 B1 | 9/2017 | Amir et al. |
| 9,939,883 B2 | 4/2018 | Swarna et al. |
| 10,042,750 B2 | 8/2018 | Roberts et al. |
| 10,564,868 B2 | 2/2020 | Afriat et al. |
| 2009/0259862 A1 | 10/2009 | Bulusu et al. |
| 2014/0132235 A1 | 5/2014 | Zhao et al. |
| 2014/0281149 A1 | 9/2014 | Roberts et al. |
| 2014/0365714 A1 | 12/2014 | Sweere et al. |
| 2015/0074436 A1 | 3/2015 | Jain et al. |
| 2016/0320995 A1 | 11/2016 | Warriner |
| 2016/0342328 A1 | 11/2016 | Rangarajan et al. |
| 2017/0147516 A1 | 5/2017 | De |
| 2017/0330528 A1 | 11/2017 | Dorsey et al. |

FIG. 10A

| Utilization (UL) | Scaling Factor of Frequency (SF_F) | Scaling Factor of voltage (SF_V) |
|---|---|---|
| 10% | + A (MHz) | + D (V) |
| 20% | + B (MHz) | +E (V) |
| ⋮ | | |
| 100% | − C (MHz) | − F (V) |

MDTa

FIG. 10B

| Delta of Utilization (DUL) | Scaling Factor of Frequency (SF_F) | Scaling Factor of voltage (SF_V) |
|---|---|---|
| −40% | − A (MHz) | − D (V) |
| −20% | − B (MHz) | −E (V) |
| ⋮ | | |
| +40% | + C (MHz) | + F (V) |

MDTb

FIG. 10C

| Temperature (TP) | Scaling Factor of Frequency (SF_F) | Scaling Factor of voltage (SF_V) |
|---|---|---|
| − 10° | + A (MHz) | + D (V) |
| 0° | + B (MHz) | +E (V) |
| ⋮ | | |
| 50° | − C (MHz) | − F (V) |

MDTc

FIG. 10D

| Delta of Temperature (DTP) | Scaling Factor of Frequency (SF_F) | Scaling Factor of voltage (SF_V) |
|---|---|---|
| − 20° | − A (MHz) | − D (V) |
| − 10° | − B (MHz) | −E (V) |
| ⋮ | | |
| + 20° | + C (MHz) | + F (V) |

(MDTd)

SOLID STATE DRIVE (SSD) AND OPERATING METHOD

CROSS-REFERENCE TO RELATED APPLICATIONS

This application is a continuation of pending U.S. application Ser. No. 16/508,711, filed on Jul. 11, 2019, the entire contents of which is hereby incorporated by reference.

Korean Patent Application No. 10-2018-0157475, filed on Dec. 7, 2018, in the Korean Intellectual Property Office, and entitled: "Storage System and Operating Method Thereof," is incorporated by reference herein in its entirety.

BACKGROUND

1. Field

Embodiments relate to a storage system, and more particularly, to a storage system including a computing device and a method of managing power of the storage system.

2. Description of the Related Art

A flash memory as a nonvolatile memory may maintain data stored therein even when power is cut off. A storage device including a flash memory, such as an embedded multimedia card (eMMC), a universal flash storage (UFS), a solid state drive (SSD), or a memory card, is widely used, and the storage device has been usefully used to store or move bulk data. Computing systems tend to be heterogeneous systems including a host taking charge of general management of the system and a computing device for acceleration-processing allocated to a particular task. The computing device may be implemented as a storage acceleration platform mounted in a storage device or formed as one module with the storage device.

SUMMARY

According to an aspect, there is provided a storage system including: a nonvolatile memory that stores data; a computing device to perform data processing on input data provided from the nonvolatile memory or a host outside the storage system; and a controller to control a writing operation and a reading operation of the nonvolatile memory, monitor an operating state of the computing device while the computing device is performing the data processing, and dynamically manage power of the computing device according to a monitoring result.

According to another aspect, there is provided an operating method of a storage system including a computing device and a storage controller, the operating method including: performing, by the computing device, data processing on received input data; receiving, by the storage controller, state information of an operating state of the computing device while the computing device is performing the data processing; and managing, by the storage controller, power of the computing device based on the received state information while the computing device is performing the data processing.

According to another aspect, there is provided a storage system including: a storage device including a nonvolatile memory and a storage controller to control writing and reading with respect to the nonvolatile memory; and a computing device to communicate with the storage controller and perform data processing on received input data, wherein the storage controller manages power of the computing device based on an operating state of the computing device.

BRIEF DESCRIPTION I/F THE DRAWINGS

Features will become apparent to those of skill in the art by describing in detail exemplary embodiments with reference to the attached drawings in which:

FIGS. 10A to 10D illustrate tables of management data according to example embodiments;

DETAILED DESCRIPTION

Figure 1:
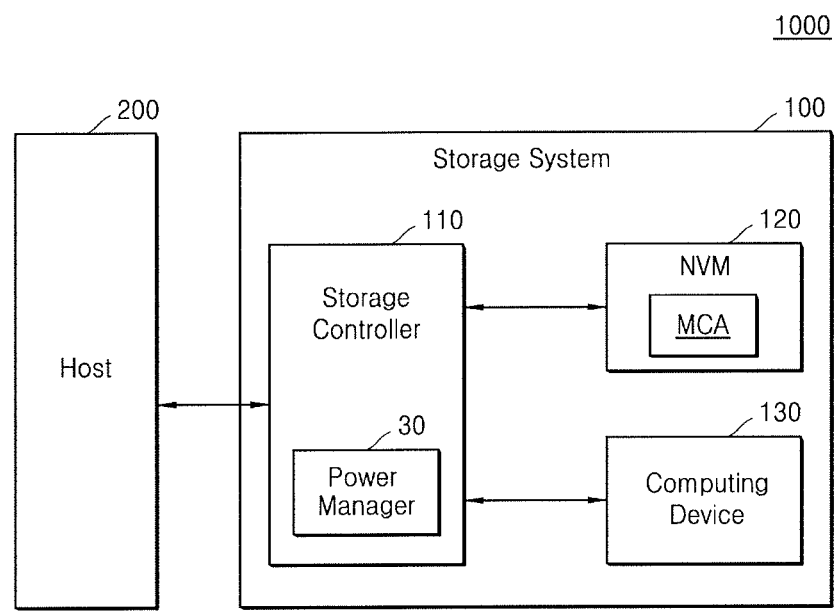
FIG. 1 illustrates a storage system and a data processing system according to an embodiment.

FIG. 1 illustrates a storage system 100 and a data processing system 1000 according to an embodiment. The data processing system 1000 may be embedded in an electronic device or implemented by the electronic device. The electronic device may be implemented as, for example, a personal computer (PC), a data server, an ultra-mobile PC (UMPC), a workstation, a net-book, a network-attached storage (NAS), a smart television, an Internet of Things (IoT) device, or a portable electronic device. The portable electronic device may be a laptop computer, a mobile phone, a smartphone, a tablet PC, a personal digital assistant (PDA), an enterprise digital assistant (EDA), a digital still camera, a digital video camera, an audio device, a portable multimedia player (PMP), a personal navigation device (PND), an MP3 player, a handheld game console, an e-book, a wearable device, or the like.

Referring to FIG. 1, the data processing system 1000 may include the storage system 100 and a host 200.

The host 200 manages a general operation of the data processing system 1000. The host 200 may store data in the storage system 100 and read data from the storage system 100. For example, the host 200 may transmit a write command and data to be written or a read command to the storage system 100. In addition, the host 200 may allocate a task and data to the storage system 100 and control the storage system 100 such that the storage system 100 performs the task by processing the data. For example, the host 200 may transmit a data processing command for performing the task to the storage system 100 together with the data to be processed in the storage system 100 or transmit a data processing command for data stored in the storage system 100 to the storage system 100.

The host 200 may be implemented by a central processing unit (CPU), a processor, a microprocessor, an application processor (AP), or the like, and according to an embodiment, the host 200 may be implemented by a system-on-chip (SoC).

According to an example embodiment, the storage system 100 may include a storage controller 110, a nonvolatile memory (NVM) 120, and a computing device 130. The storage system 100 may be named a storage device. The storage system 100 may store or process data in response to a command from the host 200. According to an embodiment, the storage system 100 may be implemented by a storage acceleration platform to accelerate data processing. For example, the storage system 100 may be a solid state drive (SSD), an embedded multimedia card (eMMC), an embedded UFS memory device, a UFS memory card, a compact flash (CF) card, a secure digital (SD) card, a micro-SD card, a mini-SD card, an extreme digital (XD) card, or a memory stick.

The NVM 120 may store data. The NVM 120 may store data provided from the host 200 or data provided from the computing device 130. The NVM 120 may include a memory cell array (MCA) including nonvolatile memory cells capable of maintaining stored data even when power of the storage system 100 is cut off, and the MCA may be divided into a plurality of memory blocks. The plurality of memory blocks may have a two-dimensional (2D) horizontal structure in which memory cells are two-dimensionally arranged on the same plane (or layer) or a three-dimensional (3D) vertical structure in which nonvolatile memory cells are three-dimensionally arranged. The memory cell may be a single-level cell (SLC) storing one-bit data, a multi-level cell (MLC) storing two-bit data, a triple-level cell (TLC) storing three-bit data or a quadruple-level cell (QLC) storing four-bit data. However, the memory call is not limited thereto, and the memory cell may store five or more-bit data.

According to some embodiments, the NVM 120 may include a plurality of dies, each including an MCA, or a plurality of chips. For example, the NVM 120 may include a plurality of chips, and each of the plurality of chips may include a plurality of dies. According to an embodiment, the NVM 120 may include a plurality of channels, each including a plurality of chips.

According to an embodiment, the NVM 120 may be a NAND flash memory device. However, the NVM 120 may be implemented by resistive memory devices such as resistive random access memory (RAM), phase change RAM, and magnetic RAM. Hereinafter, embodiments are described based on the assumption that the NVM 120 is a NAND flash memory device.

The computing device 130 is to perform data processing on received data and may perform a task allocated by the host 200. According to an embodiment, the computing device 130 may perform parallel data processing on received data, i.e., input data, by driving an application. The application may include a plurality of data operations related to task performance, e.g., an arithmetic operation, a convolution operation, a polling operation, and the like. For example, when the computing device 130 performs a neural network-based task, the application may include a neural network model. The neural network model may include a plurality of data operations and input and output sizes, weights, biases, and the like of the plurality of data operations based on at least one of various types of neural networks including a convolution neural network (CNN), a region with CNN (R-CNN), a region proposal network (RPN), a recurrent neural network (RNN), a stacking-based deep neural network (S-DNN), a state-space dynamic neural network (S-SDNN), a deconvolution network, a deep belief network (DBN), a restricted Boltzman machine (RBM), a fully convolutional network, a long short-term memory (LSTM) network, and a classification network.

For example, the computing device 130 may be implemented by a graphic processing unit (GPU), a digital signal processor (DSP), a field programmable gate array (FPGA), a neural processing unit (NPU), or the like. However, the computing device 130 is not limited thereto, and the computing device 130 may be implemented by various types of acceleration circuits (accelerators) to perform data processing required to perform an allocated task, e.g., parallel data operations.

The storage controller 110 may manage a general operation of the storage system 100 and control the NVM 120 and the computing device 130 such that an operation according to a command received from the host 200 is performed. For example, the storage controller 110 may control the NVM 120 in response to a write or read command from the host 200, such that data is written on or read from the NVM 120, and control an erase operation of the NVM 120. In addition, the storage controller 110 may manage various operations of the NVM 120, such as garbage collection, bad block management, read reclaim, and read replacement, and manage power of the NVM 120.

In addition, the storage controller 110 may control the computing device 130 such that the computing device 130 performs a task. The storage controller 110 may provide data and/or an application received from the host 200 or stored in the NVM 120 to the computing device 130. The storage controller 110 may configure or adjust an operating environment of the computing device 130. Particularly, the storage controller 110 may dynamically manage power of the computing device 130 when the computing device 130 performs a task.

The storage controller 110 may include a power manager 30. The power manager 30 may monitor a real-time operating state of the computing device 130, e.g., utilization, a temperature, a runtime, a frequency of a clock signal, a driving voltage level, and the like, and dynamically control power of the computing device 130 based on the monitoring result. The utilization indicates a use percentage of hardware resources for a unit time, i.e., a percentage of hardware resources for actual data processing among hardware resources to process data. For example, the computing device 130 may include a plurality of processing elements (PEs of FIG. 2), and at least some of the plurality of processing units may be activated (or turned-on) to process data. The utilization may indicate a percentage of processing units performing data processing among the activated processing units.

According to an embodiment, the power manager 30 may adjust at least one of a frequency of a clock signal or a driving voltage to be provided to the computing device 130. According to an embodiment, the power manager 30 may adjust a transmission rate of data to be provided to the computing device 130. According to an embodiment, the power manager 30 may adjust utilization of hardware resources of the computing device 130. For example, the power manager 30 may determine the number of at least some processing elements to be activated to perform data processing among a plurality of processing elements (PEs of FIG. 2) included in the computing device 130, and activate the at least some processing elements.

In addition, the power manager 30 may analyze a characteristic of an application and a size of data (i.e., a data amount) to be provided to the computing device 130 and configure an operating environment of the computing device 130 based on the analysis result. For example, the power manager 30 may calculate a data processing amount, i.e., a data operation amount, through analysis of the characteristic of the application and the size of the data and determine, based on the data operation amount, the number of at least some processing elements to be activated among the plurality of processing elements. The power manager 30 may manage power of the computing device 130 based on a data operation amount and an operating state of the computing device 130 while performing a task.

Figure 2:
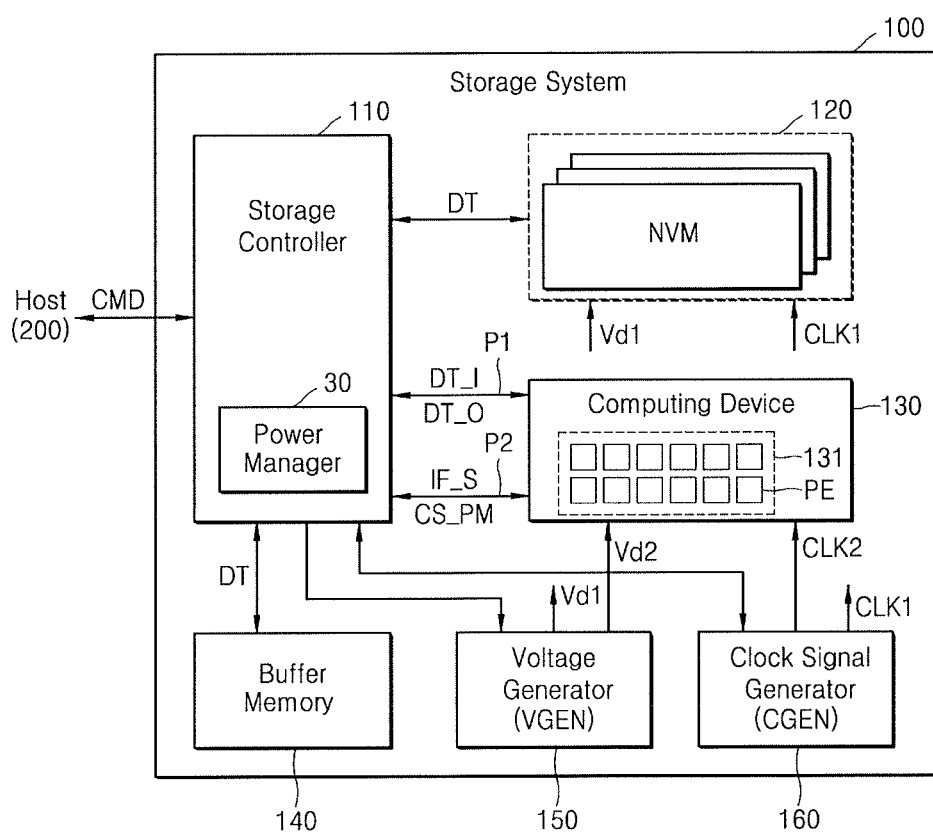
FIG. 2 illustrates the storage system according to an example embodiment.

FIG. 2 illustrates the storage system 100 according to an example embodiment. Referring to FIG. 2, the storage system 100 may include the storage controller 110, the NVM 120, the computing device 130, a buffer memory 140, a voltage generator (VGEN) 150, and a clock signal generator (CGEN) 160. The description of the storage controller 110, the NVM 120, and the computing device 130 made with reference to FIG. 1 will not be repeated.

The buffer memory 140 may operate as a buffer that temporarily store data DT in the storage system 100. The buffer memory 140 may store the data DT received from the host 200 or read from the NVM 120 and store data generated by the computing device 130, e.g., a task performance result, i.e., output data DT_O of the computing device 130. For example, when the computing device 130 performs a task based on data stored in the NVM 120, the storage controller 110 may read the data DT from the NVM 120 and store the data DT in the buffer memory 140. The storage controller 110 may transmit the data DT stored in the buffer memory 140 to the computing device 130 as input data DT_I when the computing device 130 performs a task. When the computing device 130 finishes the task, the storage controller 110 may temporarily store a task performance result, i.e., the output data DT_O of the computing device 130, in the buffer memory 140, and transmit the output data DT_O to the host 200 in response to a request from the host 200.

The buffer memory 140 may be implemented by a volatile memory, e.g., dynamic RAM (DRAM), static RAM (SRAM), and the like, by various types of nonvolatile memories, e.g., a resistive nonvolatile memory, such as MRAM, PRAM, resistive RAM (ReRAM), and the like, a flash memory, a nano floating gate memory (NFGM), polymer RAM (PoRAM), ferroelectric RAM (FRAM), and the like. In the present embodiment, the buffer memory 140 is provided outside the storage controller 110, but the buffer memory 140 may be provided inside the storage controller 110.

The VGEN 150 may generate various voltages used in the storage system 100. For example, the VGEN 150 may be implemented by a power management integrated circuit (PMIC), a power management unit (PMU), or the like. The VGEN 150 may generate the voltages based on an external voltage provided from the outside of the storage system 100, e.g., the host 200. According to an embodiment, the VGEN 150 may generate a driving voltage of the NVM 120, i.e., a first driving voltage Vd1, and a driving voltage of the computing device 130, i.e., a second driving voltage Vd2, and respectively provide the first driving voltage Vd1 and the second driving voltage Vd2 to the NVM 120 and the computing device 130. The VGEN 150 may adjust voltage levels of the first driving voltage Vd1 and/or the second driving voltage Vd2 under control of the power manager 30.

The CGEN 160 may generate various clock signals used in the storage system 100. For example, the CGEN 160 may be implemented by an oscillator, a phase locked loop (PLL), a delayed locked loop (DLL), or the like. The CGEN 160 may generate a clock signal used by the NVM 120, i.e., a first clock signal CLK1, and a clock signal used by the computing device 130, i.e., a second clock signal CLK2. The CGEN 160 may adjust frequencies of the first clock signal CLK1 and/or the second clock signal CLK2 under control of the power manager 30.

As described above with reference to FIG. 1, when the computing device 130 is performing a task, the power manager 30 of the storage controller 110 may monitor an operating state of the computing device 130 and dynamically manage power of the computing device 130 based on the monitoring result. The power manager 30 may periodically or aperiodically receive state information IF_S from the computing device 130 a plurality of times and manage power of the computing device 130 based on the state information IF_S. For example, the state information IF_S may include at least one of utilization, a temperature, or a runtime of the computing device 130 and may further include a frequency of a clock signal and a driving voltage level. The frequency of the clock signal and the driving voltage level may be received from the VGEN 150 and the CGEN 160, respectively.

The storage controller 110 may control other components of the storage system 100, e.g., the NVM 120, the computing device 130, the buffer memory 140, the VGEN 150, and the CGEN 160. The storage controller 110 may control write and read operations of the NVM 120 and data processing of the computing device 130 in response to a command CMD from the host 120.

The power manager 30 may generate a power control signal CS_PM for power control of the computing device 130 based on the state information IF_S and transmit the power control signal CS_PM to at least one of the computing device 130, the VGEN 150, or the CGEN 160.

According to an embodiment, the power manager 30 may dynamically adjust a voltage level of the second driving voltage Vd2 of the computing device 130 and/or a frequency of the second clock signal CLK2. The power manager 30 may transmit, to the VGEN 150 and/or the CGEN 160, the power control signal CS_PM indicating a change in the voltage level of the second driving voltage Vd2 and/or the frequency of the second clock signal CLK2.

According to an embodiment, the power manager 30 may determine the number of at least some processing elements PE to be activated to perform data processing among a plurality of processing elements PE included in a computing unit 131. In this case, the processing element PE is an operation circuit to process a unit operation and may be implemented by a core of a CPU, an arithmetic logic unit (ALU) of a GPU, a look-up table (LUT) of a FPGA, or the like.

The power manager 30 may transmit, to the computing device 130, an index range indicating the number of processing elements PE to be activated, as the power control signal CS_PM. Accordingly, the number of processing elements PE to be activated to perform data processing may be dynamically changed.

According to an embodiment, a first path P1 and a second path P2 may be provided between the storage controller 110 and the computing device 130, data, e.g., the input data DT_I and the output data DT_O, may be transmitted and received through the first path P1, and various types of control signals including the state information IF_S and the power control signal CS_PM may be transmitted and received through the second path P2. Different interface schemes may be applied to the first path P1 and the second path P2. A peripheral component interconnection express (PCIe) scheme may serve as the first path P1 and an inter integrated circuit (I2C) interface scheme may serve as the second path P2. In an implementation, the first path P1 and the second path P2 may be homogeneous paths to which the same interface scheme is applied.

According to an embodiment, the power manager 30 may adjust a transmission rate of the input data DT_I. When the transmission rate of the input data DT_I increases, power consumption of the computing device 130 may increase, and when the transmission rate of the input data DT_I decreases, the power consumption of the computing device 130 may decrease. However, when the transmission rate of the input data DT_I is lower than a data processing rate of the computing device 130, the performance of the computing device 130 may decrease. Therefore, the power manager 30 may determine the transmission rate of the input data DT_I based on the state information IF_S of the computing device 130 such that the power consumption of the computing device 130 decreases without performance deterioration of the computing device 130. The storage controller 110 may transmit the input data DT_I to the computing device 130 based on the determined transmission rate.

As described with reference to FIGS. 1 and 2, in the storage system 100, the storage controller 110 may configure an operating environment of the computing device 130 and dynamically manage power of the computing device 130. When the computing device 130 operates based on a constant voltage and frequency or maximally uses the plurality of processing elements PE regardless of complexity of an application and an amount of data, power consumption of the computing device 130 may increase, and the performance of the computing device 130 may decrease. However, in the storage system 100 according to an embodiment, an operating environment of the computing device 130 is according to complexity of an application and an amount of data, and power is dynamically managed based on a real-time operating state of the computing device 130, and thus, power consumption of the computing device 130 may decrease without performance deterioration.

In addition, in the storage system 100 according to an embodiment, the storage controller 110 manages power, and the host 200 determines only task allocation and a task performance time point, and thus, intervention of the host 200 may be minimized, and a workload of the host 200 may decrease.

Meanwhile, if the computing device 130 directly manages power while performing a task, hardware resources of the computing device 130 are used for the power management, and thus, the performance of the computing device 130 may decrease, but in the storage system 100 according to an embodiment, the storage controller 110 dynamically manages power of the computing device 130, and thus, the hardware resources of the computing device 130 may be maximally allocate to acceleration of driving of an application, i.e., parallel data processing, thereby improving the performance of the computing device 130.

Figure 3:
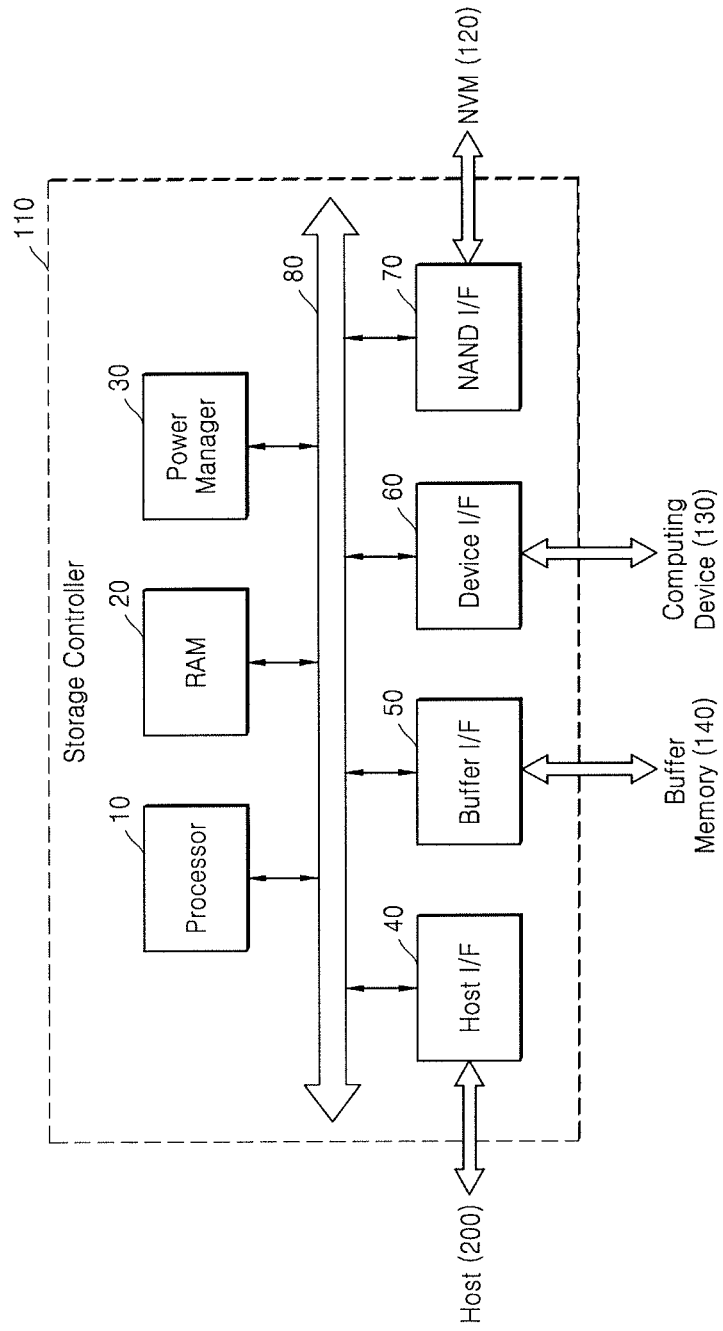
FIG. 3 illustrates a storage controller according to an example embodiment.

FIG. 3 illustrates the storage controller 110 according to an example embodiment. Referring to FIG. 3, the storage controller 110 may include a processor 10, a RAM 20, the power manager 30, a host interface (I/F) circuit 40, a buffer I/F circuit 50, a device I/F circuit 60, and a NAND I/F circuit (or NAND flash I/F) 70. The components of the storage controller 110, e.g., the processor 10, the RAM 20, the power manager 30, the host I/F circuit 40, the buffer I/F circuit 50, the device I/F circuit 60, and the NAND I/F circuit 70, may be communicate with each other via a bus 80.

The processor 10 may include a CPU, a microprocessor, or the like and control a general operation of the storage controller 110. According to an embodiment, the processor 10 may be implemented by a multi-core processor, e.g., a dual-core, quad-core processor, and the like.

The RAM 20 operates under control of the processor 10 and may be used as an operating memory, a buffer memory, a cache memory, or the like. For example, the RAM 20 may be implemented by a volatile memory, e.g., DRAM, SRAM, and the like, or a nonvolatile memory, e.g., PRAM, a flash memory, and the like. The RAM 20 may store firmware and data for controlling the storage controller 110. The stored firmware and data may be driven or processed by the processor 10. A software hierarchical structure of the storage controller 110 implemented by firmware may include an interface layer, a flash translation layer (FTL), and the like.

The power manager 30 may dynamically manage power of a storage system (100 of FIG. 2) including the storage controller 110. As described above, the power manager 30 may configure an operating environment of a computing device (130 of FIG. 2) and dynamically manage power of the computing device 130. The power manager 30 may be implemented by software (or firmware), hardware, or a combination thereof. When the power manager 30 is implemented by software, program instructions forming the power manager 30 may be loaded on the RAM 20 and executed by the processor 10.

The host I/F circuit 40 is to communicate with the external host 200 under control of the processor 10. The host I/F circuit 40 may employ at least one of various interface schemes, e.g., universal serial bus (USB), advanced technology attachment (ATA), serial ATA (SATA), parallel ATA (PATA), serial attached small computer system interface (SAS), high speed interchip (HSIC), small computer system interface (SCSI), peripheral component interconnection (PCI), PCI express (PCIe), UFS, SD, MMC, eMMC, dual in-line memory module (DIMM), registered DIMM (RDIMM), load reduced DIMM (LRDIMM), enhanced small disk interface (ESDI), integrated drive electronics (IDE), and the like.

The buffer I/F circuit 50 provides an interface between the storage controller 110 and the buffer memory 140. Data to be stored in the NVM 120, data read from the NVM 120, or output data (DT_O of FIG. 2) of the computing device 130 may be temporarily stored in the buffer memory 140 through the buffer I/F circuit 50.

The device I/F circuit 60 provides an interface between the storage controller 110 and the computing device 130. In addition, the device I/F circuit 60 may provide an interface between the storage controller 110 and a VGEN (150 of FIG. 2) and between the storage controller 110 and a CGEN (160 of FIG. 2).

The NAND I/F circuit 70 may provide an interface between the storage controller 110 and the NVM 120. For example, a mapping table, write data and read data may be transmitted and received between the storage controller 110 and the NVM 120 through the NAND I/F circuit 70. According to an embodiment, the number of NAND I/F circuits 70 may correspond to the number of nonvolatile memory chips included in the storage system 100 or the number of channels between the storage controller 110 and the NVM 120. According to an embodiment, the NAND I/F circuit 70 may be provided as a control path between the storage controller 110 and the computing device 130, e.g., a second path (P2 of FIG. 2).

In an implementation, the storage controller 110 may further include an error checking and correcting (ECC) engine or the like to encode data to be stored in the NVM 120 and decode data read from the NVM 120.

Figure 4:
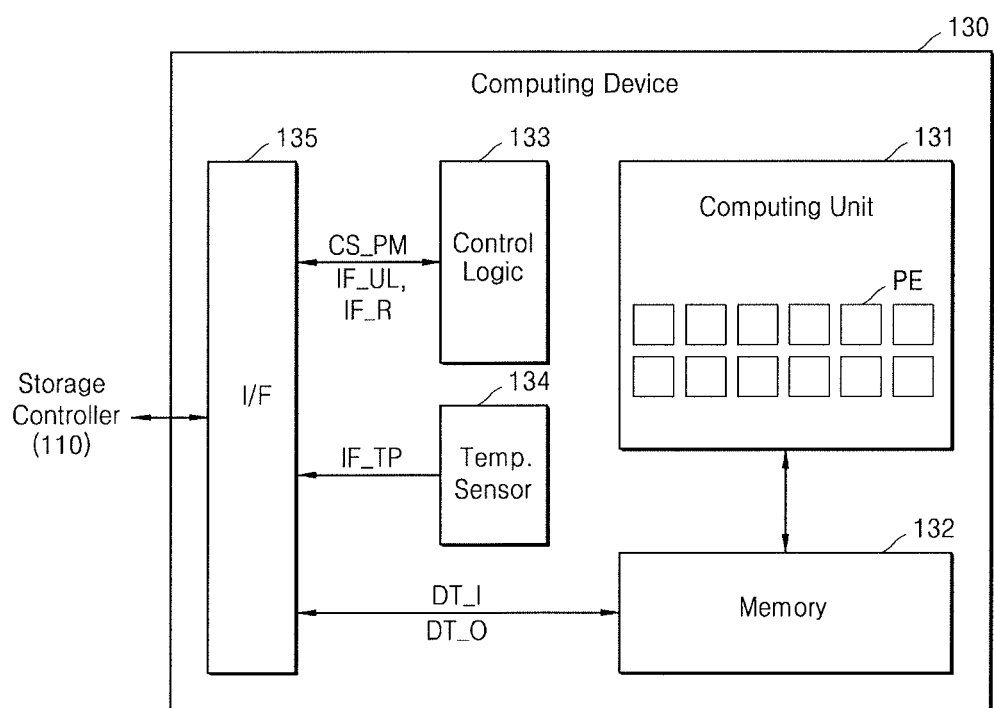
FIG. 4 illustrates a computing device according to an example embodiment.

FIG. 4 illustrates the computing device 130 according to an example embodiment. Referring to FIG. 4, the computing device 130 may include the computing unit 131, a memory 132, a control logic 133, a temperature sensor 134, and an I/F circuit 135.

The computing unit 131 may include the plurality of processing elements PE and perform a task allocated to the computing device 130. Activated processing elements PE, e.g., on-state processing elements PE, among the plurality of processing elements PE may perform data processing.

The memory 132 may store data received from the outside or generated inside the computing device 130. For example, the memory 132 may store the input data DT_I and store intermediate data and/or the output data DT_O generated when the computing unit 131 processes at least a portion of the input data DT_I. The memory 132 may also store a received application. The memory 132 may be implemented by a volatile memory, e.g., DRAM, SRAM, and the like, or nonvolatile memories, e.g., a resistive nonvolatile memory, such as MRAM, PRAM, or ReRAM, and the like, a flash memory, an NFGM, PoRAM, FRAM, and the like.

The control logic 133 may control the computing unit 131 and the memory 132 so as to perform a task based on an application. In addition, the control logic 133 may calculate utilization of a hardware resource, i.e., the computing unit 131 and a runtime of unit data processing and generate information on the utilization and the runtime, i.e., utilization information IF_UL and runtime information IF_R.

The temperature sensor 134 may sense a temperature of the inside of the computing device 130 and generate temperature information IF_TP. The temperature information IF_TP may be transmitted to the storage controller 110. When the computing device 130 performs a task, processing elements PE operate, and thus, heat may be generated. The temperature of the computing device 130 may affect the performance and durability of the computing device 130. An increase in the temperature of the computing device 130 may cause an increase in power consumption of the computing device 130. When the temperature increases above a threshold, the computing device 130 may be damaged. Therefore, power and thermal throttling of the computing device 130 may be dynamically managed based on the temperature sensed by the temperature sensor 134.

The I/F circuit 135 is to provide an interface between the storage controller 110 and the computing device 130. Through the I/F circuit 135, a control signal, e.g., the power control signal CS_PM, and the input data DT_I may be received from the storage controller 110, and state information, e.g., the utilization information IF_UL, the runtime information IF_R, and the temperature information IF_TP, or the output data DT_O may be transmitted to the storage controller 110.

Although FIG. 4 shows that the computing device 130 includes one I/F circuit 135, the computing device 130, the computing device 130 may include a plurality of I/F circuits 135. For example, when different interface schemes are applied to a data transmission path and a control signal and state information transmission path, the computing device 130 may include at least two I/F circuits 135.

Figure 5:
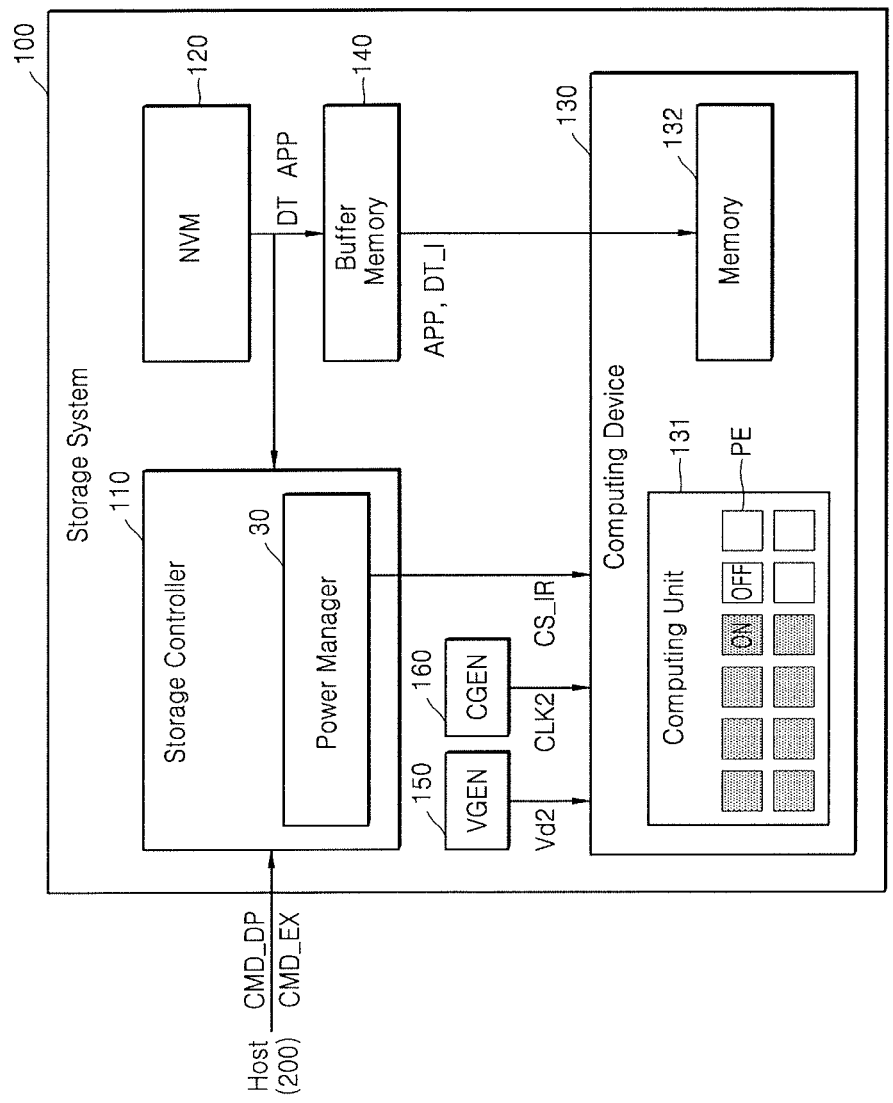
FIG. 5 illustrates an operating method of the storage system according to an example embodiment.

FIG. 5 illustrates an operating method of the storage system 100, according to an example embodiment. FIG. 5 illustrates a method of configuring an operating environment of the computing device 130.

Referring to FIG. 5, a data processing command CMD_DP may be received from the host 200. According to an embodiment, the data processing command CMD_DP may include an indication of allocating an application APP and data DT associated with a task to be performed by the computing device 130. The storage controller 110 may read the application APP and the data DT from the NVM 120 and store the application APP and the data DT in the buffer memory 140. The storage controller 110 may transmit the application APP and the data DT to the computing device 130. The data DT may be stored, as the input data DT_I, in the memory 132 of the computing device 130. According to an embodiment, the host 200 may provide at least one of the application APP or the data DT, and the application APP and the data DT transmitted from the host 200 may be temporarily stored in the buffer memory 140 and then transmitted to the computing device 130 as described above.

In this case, the power manager 30 of the storage controller 110 may analyze a characteristic of the application APP and a size of the data DT (i.e., a data amount) and configure an operating environment of the computing device 130 based on the analysis result.

According to an embodiment, the power manager 30 may calculate a data processing amount, i.e., a data operation amount, through analysis of the characteristic of the application APP and the size of the data DT and determine, based on the data operation amount, the number of at least some processing elements PE (i.e., processing elements PE to be activated) among the plurality of processing elements PE, on which data processing is to be performed. The power manager 30 may generate an index range control signal CS_IR indicating the number of at least some processing elements PE to be activated and transmit the index range control signal CS_IR to the computing device 130 as a power management control signal. The computing device 130 may activate at least some processing elements PE corresponding to the determined number among the plurality of processing elements PE in response to the index range control signal CS_IR.

According to an embodiment, the power manager 30 may determine a voltage level of the second driving voltage Vd2 and a frequency of the second clock signal CLK2 provided to the computing device 130, based on the analysis result. In an implementation, the voltage level of the second driving voltage Vd2 and the frequency of the second clock signal CLK2 may be determined according to preset initial values, respectively.

An execution command CMD_EX may be received from the host 200 and the storage controller 110 may transmit execution command CMD_EX or a control signal corresponding to the execution command CMD_EX to the computing device 130. In response to the execution command CMD_EX, the computing device 130 may perform a task by performing data processing on the input data DT_I based on the application APP.

Figure 6:
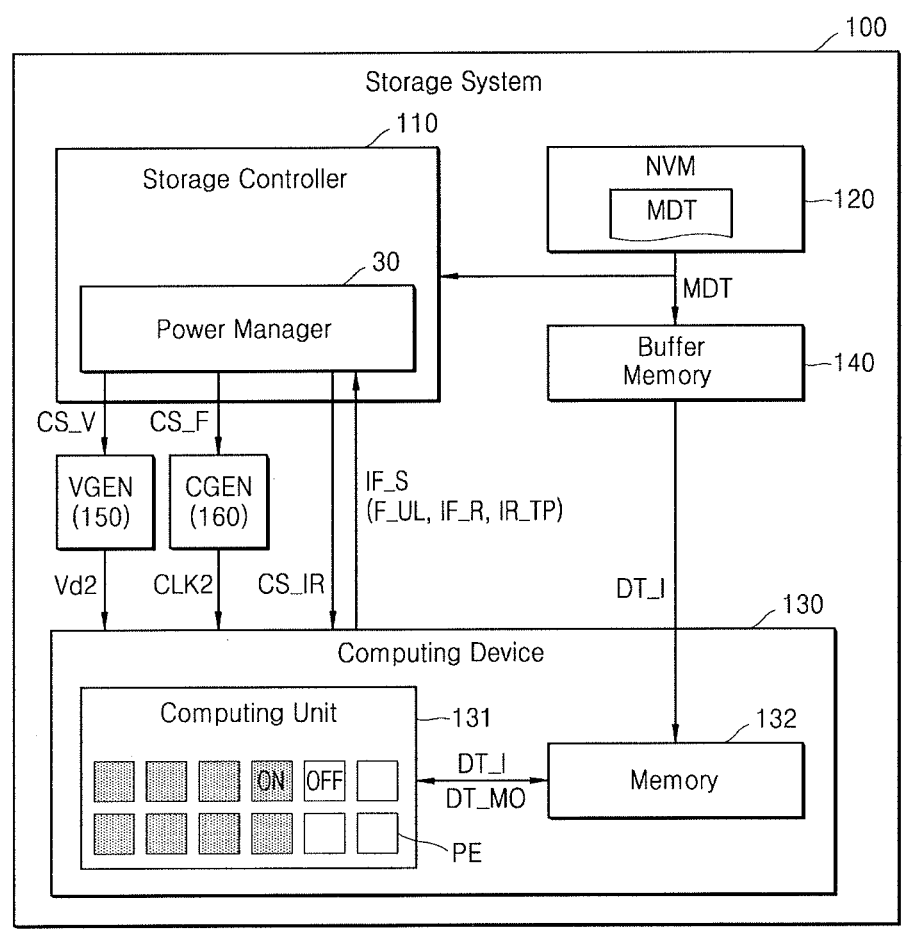
FIG. 6 illustrates an operating method of the storage system according to an example embodiment.

FIG. 6 illustrates an operating method of the storage system 100 according to an example embodiment. FIG. 6 illustrates a method of dynamically managing power of the computing device 130.

Referring to FIG. 6, the computing device 130 may perform data processing on the input data DT_I. Activated processing elements PE, i.e., on-state processing elements PE, may perform data processing on the input data DT_I according to an allocated application. An intermediate processing result DT_MO generated according to the data processing may be stored in the memory 132 and reused in the data processing. The data DT to be processed, which is stored in the buffer memory 140, may be transmitted to the computing device 130 as the input data DT_I in a certain unit, e.g., a packet unit.

While the computing device 130 is operating, i.e., while a task is being performed, the storage controller 110 may manage power of the computing device 130. The storage controller 110 may monitor an operating state of the computing device 130 while the computing device 130 is performing a task. In detail, the power manager 30 may monitor an operating state of the computing device 130 by receiving the state information IF_S from the computing device 130. The state information IF_S may include at least one of the utilization information IF_UL, the runtime information IF_R, or the temperature information IF_TP. The power manager 30 may also receive voltage level information of the second driving voltage Vd2 and frequency information of the second clock signal CLK2. According to an embodiment, the storage controller 110 may periodically or aperiodically receive the state information IF_S.

The power manager 30 may manage power of the computing device 130 based on the state information IF_S. As one example, the power manager 30 may dynamically adjust at least one of a voltage level of the second driving voltage Vd2 or a frequency of the second clock signal CLK2 based on the utilization information IF_UL. For example, the power manager 30 may increase the frequency and the voltage level when utilization of the computing device 130 is lower than a target value. The power manager 30 may transmit a voltage control signal CS_V and a frequency control signal CS_F indicating a change in the frequency and the voltage level to the VGEN 150 and the CGEN 160, respectively. The VGEN 150 and the CGEN 160 may change the voltage level of the second driving voltage Vd2 and the frequency of the second clock signal CLK2 based on the voltage control signal CS_V and the frequency control signal CS_F, respectively.

The power manager 30 may also adjust at least one of the voltage level of the second driving voltage Vd2 or the frequency of the second clock signal CLK2 based on the temperature information IF_TP. For example, the power manager 30 may decrease the frequency and the voltage level when a temperature of the computing device 130 is higher than a target value. Accordingly, thermal throttling of the computing device 130 may be dynamically managed.

As another example, the power manager 30 may adjust utilization of hardware resources of the computing device 130 based on the utilization information IF_UL. For example, the power manager 30 may manage the number of at least some processing elements PE to be activated among the plurality of processing elements PE. For example, the power manager 30 may decrease the number of at least some processing elements PE to be activated when utilization is lower than a target value. The power manager 30 may transmit, to the computing device 130, the index range control signal CS_IR indicating a changed value of the number of at least some processing elements PE to be activated. The computing unit 131 may decrease the number of at least some processing elements PE to be activated, based on the index range control signal CS_IR.

As another example, the power manager 30 may adjust a transmission rate of the input data DT_I based on the runtime information IF_R. For example, when a runtime is faster than a reference value, the transmission rate of the input data DT_I may be increased.

Figure 7A:
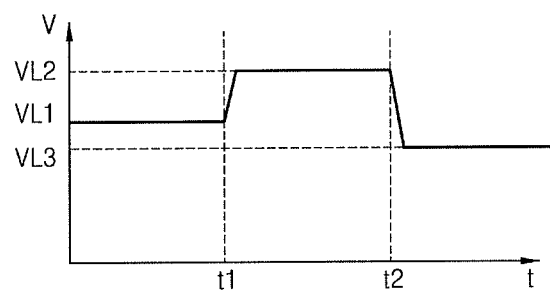
FIGS. 7A and 7B illustrate graphs showing examples of dynamically adjusting a voltage level of a driving voltage and a frequency of a clock signal, the voltage level and the frequency being provided to a computing device in a storage system according to an embodiment.
Figure 7B:
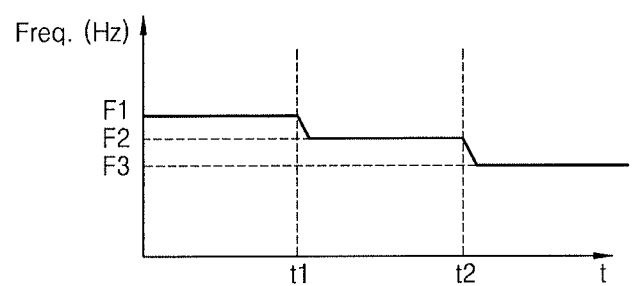

FIGS. 7A and 7B are graphs showing examples of dynamically adjusting a voltage level of a driving voltage and a frequency of a clock signal provided to a computing device in a storage system according to an embodiment. Referring to FIGS. 6 and 7A, the power manager 30 may dynamically change a voltage level of a driving voltage (the second driving voltage Vd2) to be provided to the computing device 130. Referring to FIGS. 6 and 7B, the power manager 30 may dynamically change a frequency of a clock signal (the second clock signal CLK2) to be provided to the computing device 130.

As described above with reference to FIG. 6, the power manager 30 may periodically or aperiodically receive the state information IF_S and change the voltage level of the driving voltage based on the state information IF_S. For example, the power manager 30 may receive the state information IF_S at a time point t1 and change the voltage level of the driving voltage from a first level VL1 to a second level VL2 based on the state information IF_S, and thereafter, receive the state information IF_S at a time point t2 and change the voltage level of the driving voltage from the second level VL2 to a third level VL3 based on the state information IF_S.

As described above with reference to FIG. 6, the power manager 30 may periodically or aperiodically receive the state information IF_S and change the frequency of the clock signal, i.e., the second clock signal CLK2 based on the state information IF_S. For example, the power manager 30 may receive the state information IF_S at the time point t1 and change the frequency of the clock signal from a first frequency F1 to a second frequency F2 based on the state information IF_S, and thereafter, receive the state information IF_S at the time point t2 and change the frequency of the clock signal from the second frequency F2 to a third frequency F3 based on the state information IF_S.

As described above, the power manager 30 may dynamically change the voltage level of the driving voltage and the frequency of the clock signal provided to the computing device 130 according to an operating state of the computing device 130.

Figure 8A:
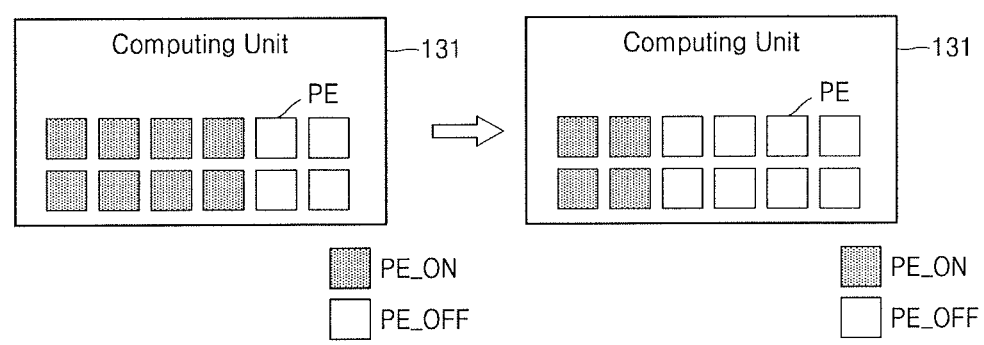
FIGS. 8A and 8B illustrate examples of adjusting hardware utilization of a computing device in a storage system according to an embodiment.
Figure 8B:
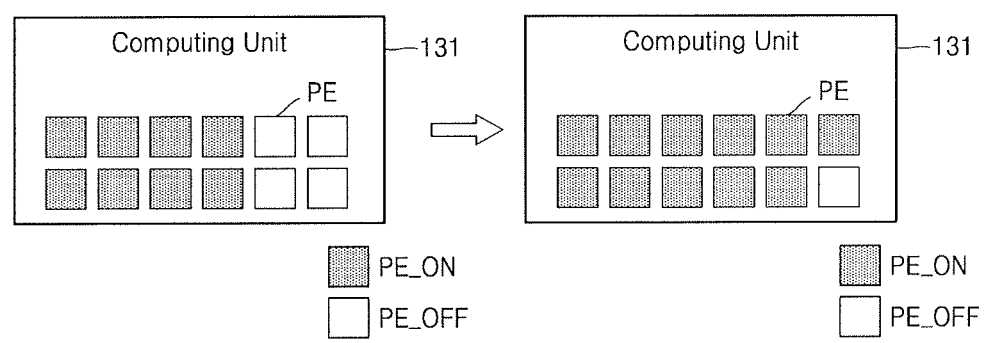

FIGS. 8A and 8B show examples of adjusting hardware utilization of a computing device in a storage system according to an embodiment. Referring to FIGS. 8A and 8B, the computing unit 131 included in the computing device may include the plurality of processing elements PE. A power manager (30 of FIG. 6) may decrease the number of at least some processing elements PE to be activated, as shown in FIG. 8A, or may increase the number of at least some processing elements PE to be activated, as shown in FIG. 8B, based on state information (IF_S of FIG. 6). The power manager 30 may adjust the number of at least some processing elements PE to be activated according to an operating state of the computing device 130.

Figure 9:
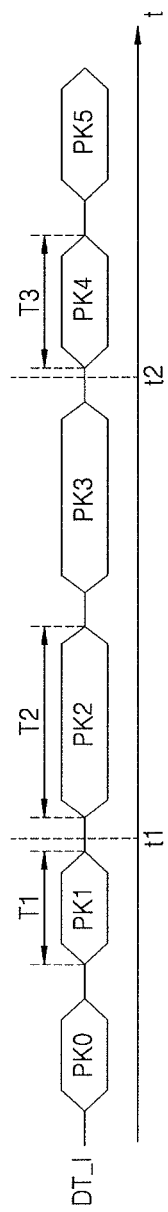
FIG. 9 illustrates an example of adjusting a transmission rate of input data to be transmitted to a computing device in a storage system according to an embodiment.

FIG. 9 shows an example of adjusting a transmission rate of input data to be transmitted to a computing device in a storage system according to an embodiment. Referring to FIGS. 6 and 9, the input data DT_I may be transmitted from the buffer memory 140 to the computing device 130 in a certain unit, and the power manager 30 may adjust a transmission rate.

For example, the input data DT_I may be transmitted in a packet unit. First to sixth packets PK0 to PK5 may be sequentially transmitted to the computing device 130. The power manager 30 may receive the state information IF_S at the time point t1 and decrease the transmission rate based on the state information IF_S such that the third packet PK2 and the fourth packet PK3 are transmitted for a period T2 longer than a period T1 during which the first packet PK0 and the second packet PK1 were previously transmitted. Thereafter, the power manager 30 may receive the state information IF_S at the time point t2 and increase the transmission rate based on the state information IF_S. After the time point t2, the transmission rate of the input data DT_I may be increased such that the fifth packet PK4 and the sixth packet PK5 are transmitted for a period T3 shorter than the period T2 for which the third packet PK2 and the fourth packet PK3 were transmitted.

Referring to FIG. 6, the power manager 30 may manage power based on management data MDT. The management data MDT may be stored in the NVM 120, and the storage controller 110 may load the management data MDT in the buffer memory 140 or internal RAM (20 of FIG. 3) and manage power with reference to the management data MDT based on the state information IF_S. The management data MDT is data for power management of the computing device 130 and may be a data table, metadata, a bitfile, and the like. For example, the management data MDT may include scaling factors of a driving voltage and a frequency of a clock signal corresponding to utilization.

FIGS. 10A to 10D are tables illustrating management data according to example embodiments. In FIGS. 10A to 10D, A, B, and C are values of a frequency scaling factor SF_F, while D, E, and F are values of a voltage scaling factor SF_V.

Referring to FIG. 10A, management data MDTa may include a frequency scaling factor SF_F and a voltage scaling factor SF_V corresponding to utilization UL. For example, when the utilization UL of the computing device 130 is 20%, the power manager 30 may increase a frequency of a clock signal, i.e., the second clock signal CLK2, by B MHz (Megahertz) and/or increase a voltage level of a driving voltage, i.e., the second driving voltage Vd2, by E V (Voltage), based on the frequency scaling factor SF_F and the voltage scaling factor SF_V, respectively.

Referring to FIG. 10B, management data MDTb may include a frequency scaling factor SF_F and a voltage scaling factor SF_V corresponding to a difference between current utilization and target utilization, i.e., a delta value of utilization DUL. For example, when the current utilization is 80%, and the target utilization is 60%, the power manager 30 may decrease the frequency of the second clock signal CLK2 by B MHz and/or decrease the voltage level of the second driving voltage Vd2 by E V, based on the frequency scaling factor SF_F and the voltage scaling factor SF_V corresponding to the delta value of utilization DUL, i.e., −20%.

Referring to FIG. 10C, management data MDTc may include a frequency scaling factor SF_F and a voltage scaling factor SF_V corresponding to a temperature TP. For example, when a temperature of the computing device 130 is 50°, the power manager 30 may decrease the frequency of the second clock signal CLK2 by C MHz and/or decrease the voltage level of the second driving voltage Vd2 by F V, based on the frequency scaling factor SF_F and the voltage scaling factor SF_V corresponding to the temperature TP that is 50°.

Referring to FIG. 10D, management data MDTd may include a frequency scaling factor SF_F and a voltage scaling factor SF_V corresponding to a difference between current temperature and a target temperature, i.e., a delta value of temperature DTP. For example, when the current temperature is 50°, and the target temperature is 30°, the delta value of temperature DTP is −20°, and the power manager 30 may decrease the frequency of the second clock signal CLK2 by A MHz or decrease the voltage level of the second driving voltage Vd2 by D V, based on the frequency scaling factor SF_F and the voltage scaling factor SF_V corresponding to the delta value of temperature DTP, i.e., −20°.

A method, performed by the power manager 30, of managing power of the computing device 130 based on the state information IF_S and management data have been described as an example. However, the power manager 30 may manage power of the computing device 130 in various methods based on the state information IF_S, and the management data may be configured in various formats.

Figure 11:
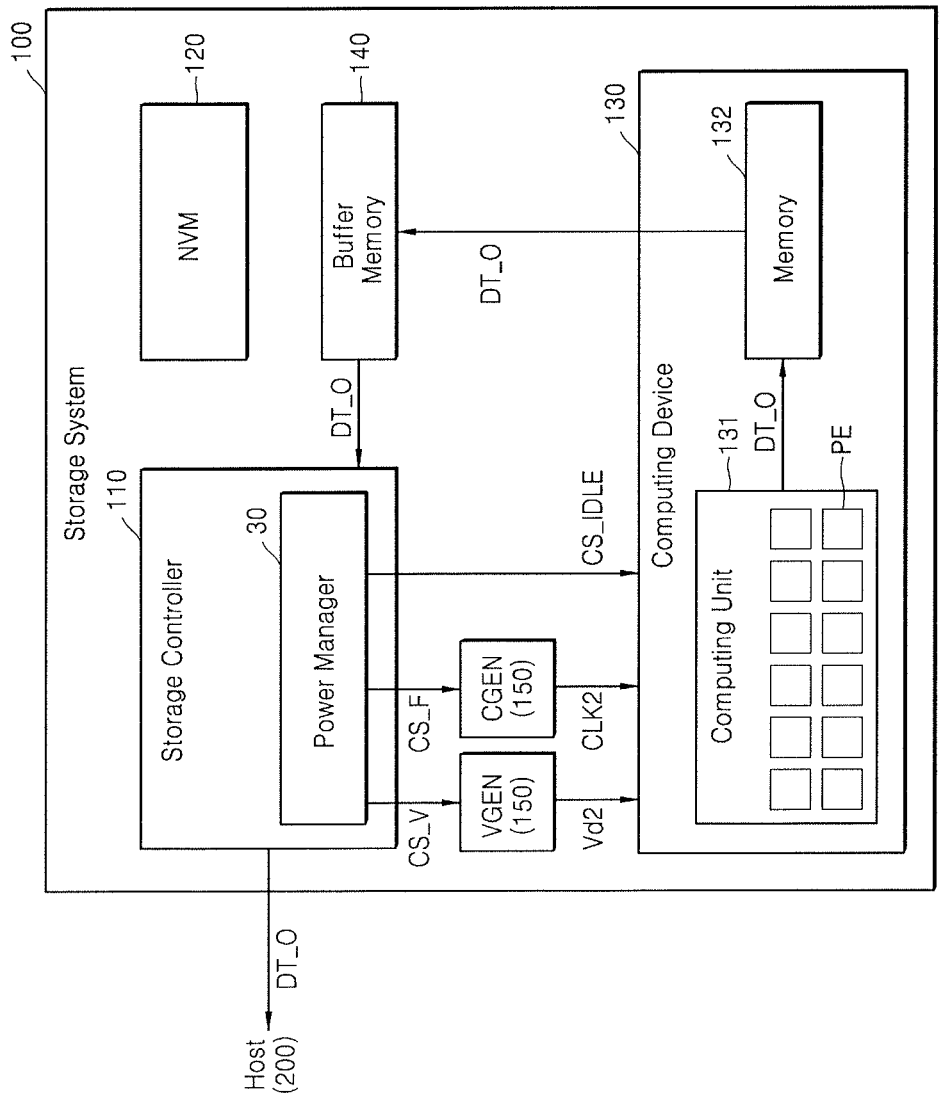
FIG. 11 illustrates an operating method of the storage system according to an example embodiment.

FIG. 11 illustrating an operating method of the storage system 100 according to an example embodiment. FIG. 11 illustrates an operating method of the storage system 100 after the computing device 130 finishes a task.

Referring to FIG. 11, when a task is finished, a task performance result, i.e., the output data DT_O, may be stored in the memory 132. The storage controller 110 may store the output data DT_O from the computing device 130 in the buffer memory 140.

The storage controller 110 may control the computing device 130 such that the computing device 130 is in a low-power state (idle state or off state). For example, the storage controller 110 may transmit, to the computing device 130, a state switching signal CS IDLE indicating switching to the idle state. According to an embodiment, the storage controller 110 may transmit the voltage control signal CS_V and the frequency control signal CS_F for controlling the second driving voltage Vd2 and the second clock signal CLK2 to the VGEN 150 and the CGEN 160, respectively, such that a voltage level of the second driving voltage Vd2 and a frequency of the second clock signal CLK2 provided to the computing device 130, have minimum values, respectively. Accordingly, the computing device 130 may switch to the idle state and power consumption of the computing device 130 may be minimized.

The storage controller 110 may transmit the output data DT_O to the host 200. For example, the storage controller 110 may transmit the output data DT_O to the host 200 in response to a request from the host 200.

Figure 12:
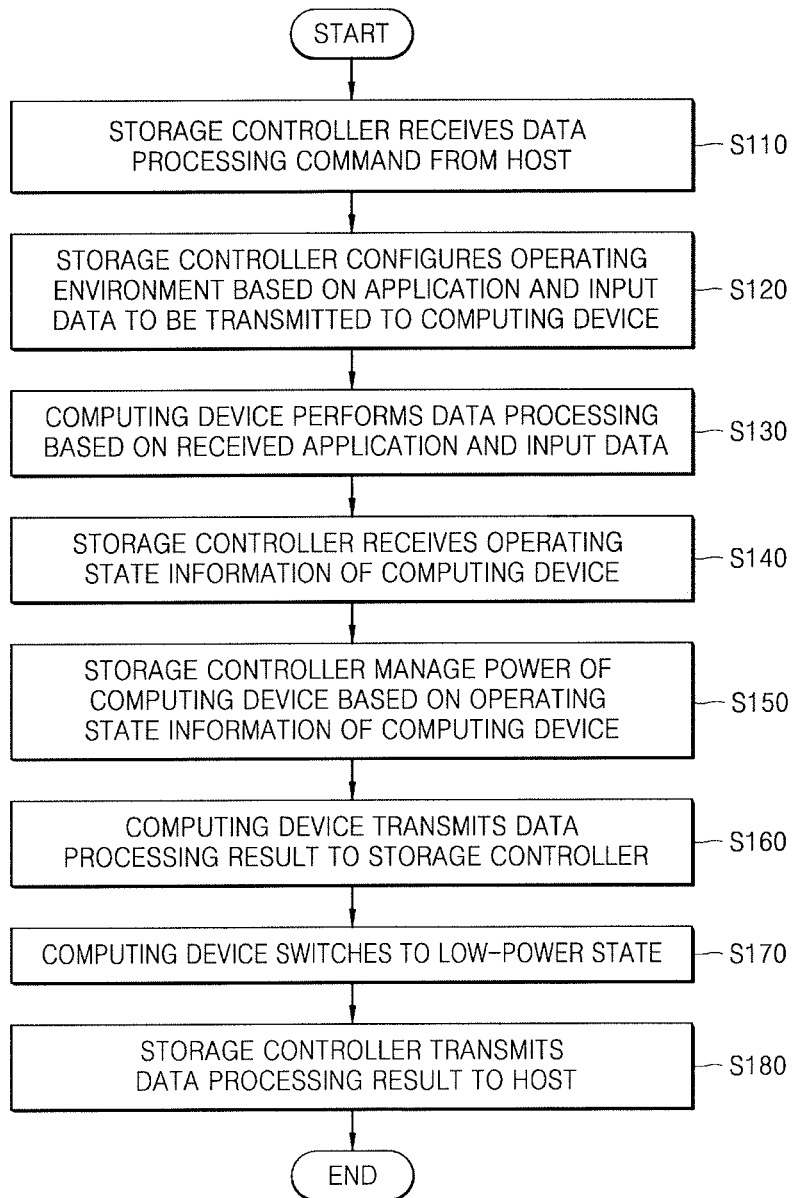
FIG. 12 illustrates a flowchart of an operating method of a storage system, according to an example embodiment.

FIG. 12 is a flowchart of an operating method of a storage system, according to an example embodiment. The present embodiment relates to an operating method of the storage system 100 of FIG. 1, and thus, the description made above with reference to FIGS. 1 to 11 is applied to the present embodiment.

Referring to FIG. 12, in operation S110, the storage controller 110 may receive a data processing command from the host 200. The data processing command may include an indication of allocating an application and input data associated with a task to be performed by the computing device 130. According to an embodiment, the storage controller 110 may read the application and the input data from the NVM 120. According to an embodiment, the application and the input data may be provided from the host 200.

In operation S120, the storage controller 110 may configure an operating environment of the computing device 130 based on the application and the input data to be transmitted to the computing device 130. According to an embodiment, the storage controller 110 may analyze a characteristic of the application and an amount of the input data. The storage controller 110 may calculate a data operation amount based on the analysis result and determine hardware utilization of the computing device 130 based on the data operation amount. For example, the storage controller 110 may determine (or adjust) the number of at least some processing elements that are activated to perform data processing among a plurality of processing elements included in the computing device 130.

In operation S130, the computing device 130 may perform data processing based on the received application and input data. The computing device 130 may perform the data processing in the operating environment configured in operation S120.

In operation S140, the storage controller 110 may receive an operating state, e.g. state information, of the computing device 130 while the computing device 130 is performing the data processing. The storage controller 110 may receive the operating state of the computing device 130 by periodically or aperiodically monitoring the computing device 130. The storage controller 110 may receive information on characteristics, e.g., utilization, runtime, temperature, and the like, of the computing device 130 and may further receive a voltage level of a driving voltage and a frequency of a clock signal of the computing device 130. According to an embodiment, the computing device 130 may periodically transmit the information to the storage controller 110 in response to a request of the storage controller 110.

In operation S150, the storage controller 110 may manage power of the computing device 130 based on the operating state of the computing device 130. As described with reference to FIGS. 6 to 10, the storage controller 110 may dynamically manage power of the computing device 130 based on various data indicating the operating state of the computing device 130. The computing device 130 may perform data processing in an operating environment changed according to the power management of the storage controller 110. For example, the storage controller 110 may change a level of a driving voltage of the computing device 130 and/or a frequency of a clock signal of the computing device 130 based on the operating state. Accordingly, the computing device 130 may perform the data processing based on the voltage level-changed driving voltage and the frequency-changed clock signal.

When the data processing is finished, the computing device 130 may transmit a data processing result to the storage controller 110 and switch to the low-power state in operation S170. According to an embodiment, the storage controller 110 may store the received data processing result in the buffer memory 140 and transmit a control signal for controlling the computing device 130 to the low-power state, e.g., the idle state or off state, to the computing device 130.

In operation S180, the storage controller 110 may transmit the data processing result to the host 200. According to an embodiment, the storage controller 110 may transmit the data processing result to the host 200 in response to a request of the host 200.

Figure 13:
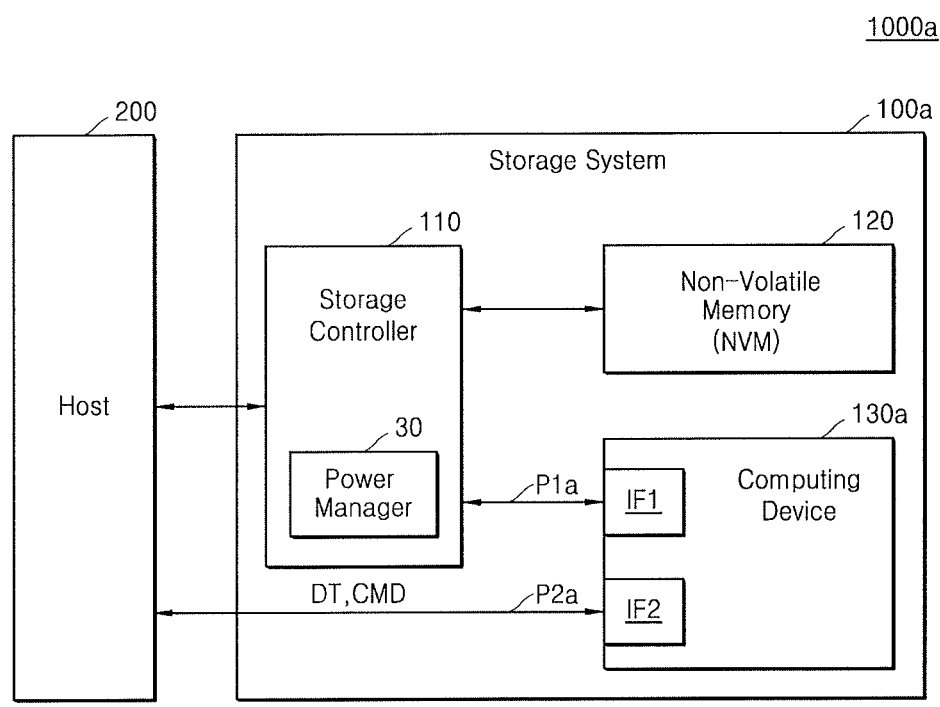
FIG. 13 illustrates a storage system and a data processing system according to an embodiment.

FIG. 13 illustrates a storage system 100a and a data processing system 1000a according to an embodiment. Referring to FIG. 13, the data processing system 1000a may include the host 200 and the storage system 100a, and the storage system 100a may include the storage controller 110, the NVM 120, and a computing device 130a. A configuration and an operation of the data processing system 1000a of FIG. 13 are similar to those of the data processing system 1000 of FIG. 1.

FIG. 13 only differs from FIG. 1 in that the computing device 130a may directly communicate with the host 200. The computing device 130a may communicate with the storage controller 110 through the first path P1a and communicate with the host 200 through the second path P2a. The computing device 130a may include a first interface IF1 for communicating with the storage controller 110 and a second interface IF2 for communicating with the host 200.

Communications and operations between the storage controller 110 and the computing device 130a may be the same as described above with reference to FIGS. 1 to 12. The storage controller 110 may monitor an operating state of the computing device 130a and dynamically manage power of the computing device 130a.

The computing device 130a may receive data DT or a command CMD not stored in the NVM 120 through the second path P2a from the host 200. For example, the computing device 130a may receive real-time data DT (e.g. log data) from the host 200 through the second path P2a and process the received data DT. According to an embodiment, the computing device 130a may receive an application through the second path P2a. The computing device 130a may directly transmit a data processing result to the host 200 through the second path P2a. Alternatively, the computing device 130a may transmit the data processing result to the storage controller 110 through the first path P1a and the storage controller 110 may transmit the data processing result to the host 200.

Figure 14:
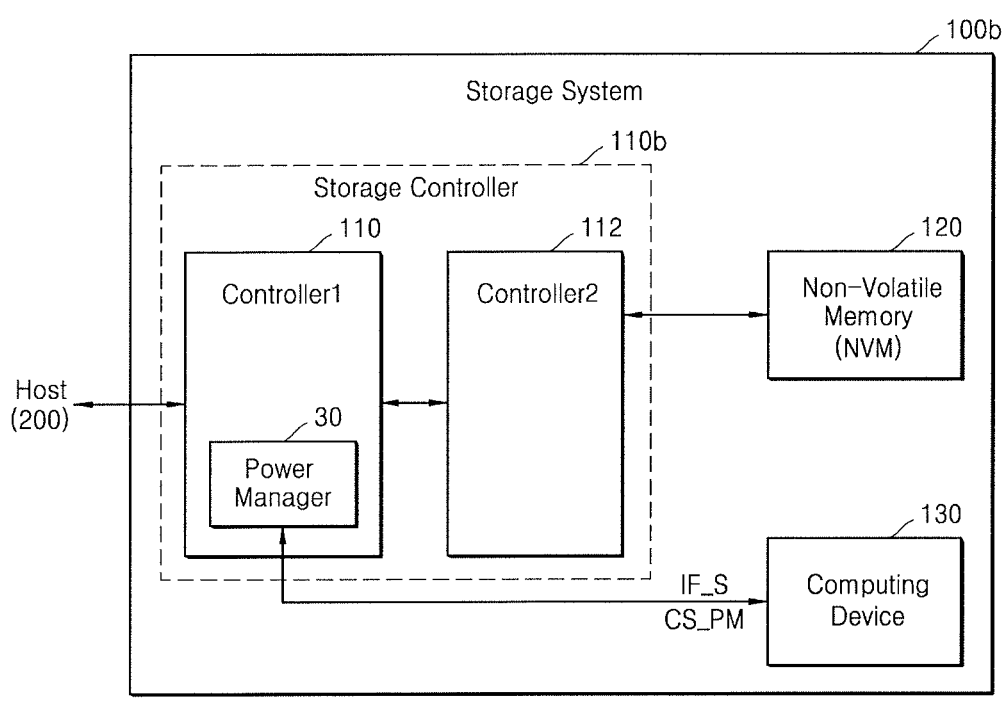
FIG. 14 illustrates a storage system according to an example embodiment.

FIG. 14 illustrates a storage system 100b according to an example embodiment. Referring to FIG. 14, the storage system 100b may include a storage controller 110b, the NVM 120, and the computing device 130. The storage controller 110b may include a first controller 111 and a second controller 112. The storage system 100b may further include a buffer memory, a VGEN, a CGEN, and the like.

The first controller 111 may manage a general operation of the storage system 100b and the second controller 112 may manage a write/read operation of the NVM 120. The first controller 111 may manage power of the storage system 100b, e.g., dynamically manage power of the computing device 130. The first controller 111 may include the power manager 30, and the power manager 30 may periodically or aperiodically receive the state information IF_S indicating an operating state of the computing device 130 and generate the power control signal CS_PM for controlling power of the computing device 130, based on the state information IF_S. A detailed operation of the power manager 30 has been described above.

The second controller 112 may be between the first controller 111 and the NVM 120 and may schedule a programming operation of the NVM 120. For example, the first controller 111 may communicate with the host 200 and transmit write data received from the host 200 to the second controller 112. The second controller 112 may buffer the data received from the first controller 111 and schedule a program of the data. According to an embodiment, the first controller 111 may translate a logical address into a physical address and transmit the physical address to the second controller 112. The second controller 112 may control the NVM 120 such that the write data is programmed in a storage area corresponding to the physical address among storage areas of the NVM 120.

According to an embodiment, each of the first controller 111 and the second controller 112 may be implemented by a semiconductor device, e.g., a semiconductor chip, and include at least one interface circuit for communication with an external device. The first controller 111 may include interface circuits for communication with the host 200, the second controller 112, and the computing device 130, and the second controller 112 may include interface circuits for communication with the first controller 111 and the NVM 120.

Figure 15:
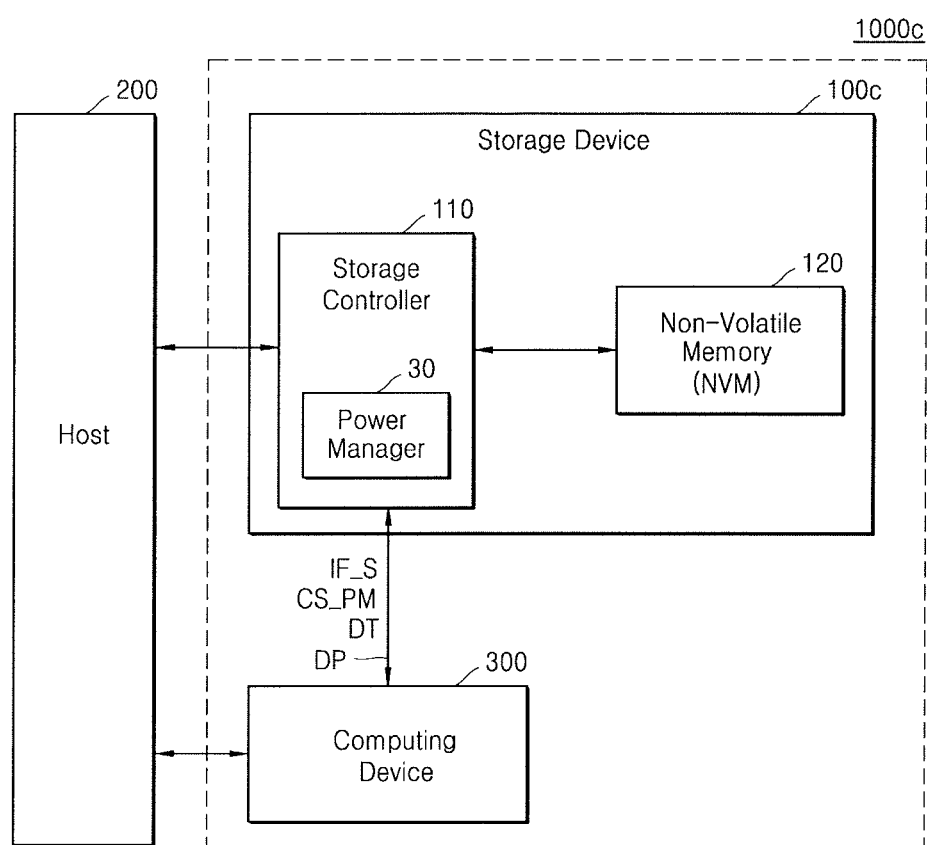
FIG. 15 illustrates a data processing system according to an example embodiment.

FIG. 15 illustrates a data processing system 1000c according to an example embodiment. Referring to FIG. 15, the data processing system 1000c may include the host 200, a storage device 100c, and a computing device 300. The storage device 100c may include the storage controller 110 and the NVM 120. Each of the storage device 100c and the computing device 300 may be implemented by a semiconductor device, e.g., a semiconductor chip or a semiconductor module, and the storage device 100c and the computing device 300 may be referred to as a storage system.

The storage device 100c may communicate with the host 200 and directly communicate with the computing device 300 through a direct path DP. The storage device 100c may transmit data DT to the computing device 300 through the direct path DP and dynamically manage power of the computing device 300. The power manager 30 included in the storage controller 110 may periodically or aperiodically receive the state information IF_S of the computing device 300 and dynamically manage power of the computing device 300 based on the state information IF_S. The power manager 30 may generate the power control signal CS_PM for controlling power of the computing device 300 and transmit the power control signal CS_PM to the computing device 300.

The computing device 300 may perform a task based on the task and data allocated from the host 200. That is, the computing device 300 may perform data processing. The computing device 300 may receive, from the host 200, an application and input data for performing the task. According to an embodiment, the computing device 300 may directly communicate with the host 200 and receive the application and the input data from the host 200.

Figure 16:
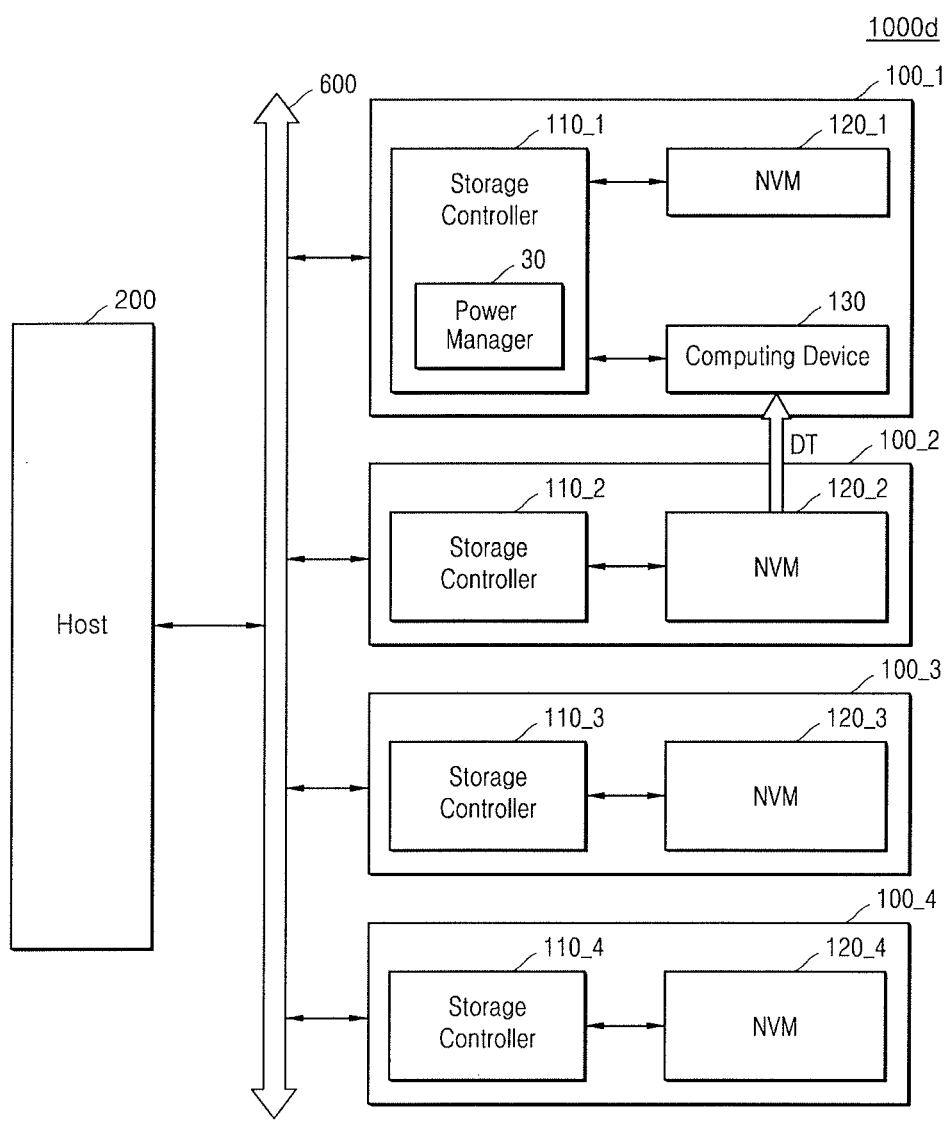
FIG. 16 illustrates a data processing system according to an example embodiment.

FIG. 16 illustrates a data processing system 1000d according to an example embodiment. Referring to FIG. 16, the data processing system 1000d may include a plurality of (first to fourth) storage systems 100_1, 100_2, 100_3, and 100_4, and the host 200. The plurality of storage systems 100_1, 100_2, 100_3, and 100_4, and the host 200 may communicate with each other via a bus 600.

The plurality of storage systems 100_1, 100_2, 100_3, and 100_4 may include storage controllers 110_1, 110_2, 110_3, and 110_4 and NVMs 120_1, 120_2, 120_3, and 120_4, respectively. At least one of the plurality of storage systems 100_1, 100_2, 100_3, and 100_4, e.g., the first storage system 110_1, may include the computing device 130. The storage systems 100, 100a, and 100b described with reference to FIGS. 1, 13, and 14 may be serve as the first storage system 110_1, and the power manager 30 included in the storage controller 110_1 may dynamically manage power of the computing device 130 based on an operating state of the computing device 130.

The computing device 130 may perform data processing on data stored in the first storage system 110_1, i.e., data stored in the NVM 120_1, or data DT provided from another storage system 100_2, 100_3, or 100_4. For example, the second storage system 100_2 may transmit the data DT to the first storage system 110_1, and the computing device 130 may perform data processing on the data DT received from the second storage system 100_2. According to an embodiment, the second storage system 100_2 may directly transmit the data DT to the first storage system 110_1 by a direct memory access (DMA) scheme without passing through the host 200.

According to an embodiment, each of the plurality of storage systems 100_1, 100_2, 100_3, and 100_4 may be implemented by one module and mounted in a slot on a main board. For example, the plurality of storage systems 100_1, 100_2, 100_3, and 100_4 may be mounted in PCIe slots and communicate with the host 200 and another storage system through a PCIe bus. Because at least one of the plurality of storage systems 100_1, 100_2, 100_3, and 100_4, e.g., the first storage system 110_1, includes the computing device 130, a separate slot in which the computing device 130 is to be mounted is not required. Accordingly, the data processing system 1000d according to an embodiment may include an acceleration function and maintain a data storage capacity. In addition, because the storage controller 110_1 of the first storage system 110_1 dynamically manages power of the computing device 130, the performance of the computing device 130 may be improved, and a workload of the host 200 for power management may decrease.

Figure 17:
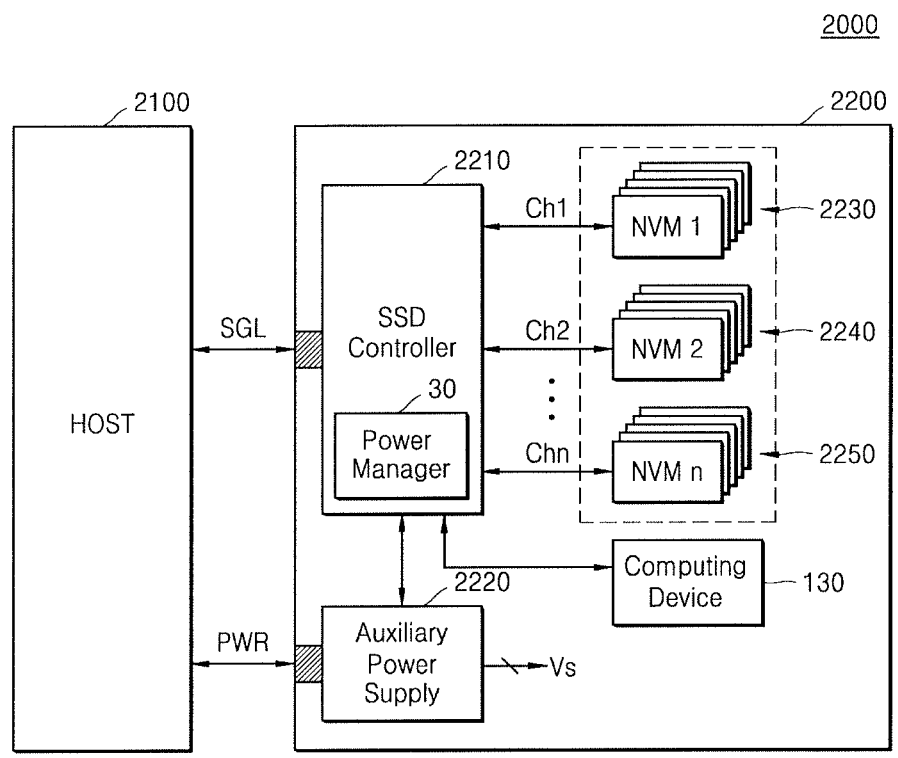
FIG. 17 illustrates a solid state drive (SSD) system according to an example embodiment.

FIG. 17 illustrates an SSD system 2000 according to an example embodiment. Referring to FIG. 17, the SSD system 2000 may include a host 2100 and an SSD 2200. The SSD 2200 may transmit and receive a signal SGL to and from the host 2100 through a signal connector and receive power PWR through a power connector. The SSD 2200 may include an SSD controller 2210, a plurality of memory devices 2230, 2240, and 2250, the computing device 130, and an auxiliary power supply 2220. The storage systems 100, 100a, and 100b of FIGS. 1, 13, and 14 may serve as the SSD 2200. The power manager 30 included in the SSD controller 2210 may dynamically manage power of the computing device 130 based on an operating state of the computing device 130. The auxiliary power supply 2220 may generate voltages Vs of various currents to be used by the SSD 2200, e.g., a driving voltage of the computing device 130. The power manager 30 may adjust a voltage level of the driving voltage of the computing device 130 by controlling the auxiliary power supply 2220 based on the operating state of the computing device 130. In addition, the power manager 30 may dynamically adjust a frequency of a clock signal of the computing device 130 or hard resource utilization of the computing device 130 based on the operating state of the computing device 130. Accordingly, the performance of the computing device 130 may be improved, and a workload of the host 2100 for power management may decrease.

The storage systems according to the embodiments described above may be mounted in or applied to not only the SSD system 2000, but also a memory card system, a computing system, a UFS, and the like.

Embodiments provide a storage system including a computing device, wherein a storage controller dynamically manages power of the computing device according to an operating state of the computing device, and an operating method of the storage system.

Embodiments are described, and illustrated in the drawings, in terms of functional blocks, units, modules, and/or methods. Those skilled in the art will appreciate that these blocks, units, modules, and/or methods are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units, modules, and/or methods being implemented by microprocessors or similar, they may be programmed using software (e.g., microcode) to perform various functions discussed herein and may optionally be driven by firmware and/or software. Alternatively, each block, unit, module, and/or method may be implemented by dedicated hardware, or as a combination of dedicated hardware to perform some functions and a processor (e.g., one or more programmed microprocessors and associated circuitry) to perform other functions. Also, each block, unit, and/or module of the embodiments may be physically separated into two or more interacting and discrete blocks, units and/or modules without departing from the scope of the disclosure. Further, the blocks, units and/or modules of the embodiments may be physically combined into more complex blocks, units and/or modules without departing from the scope of the disclosure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A solid state drive (SSD), comprising:
a nonvolatile memory including a memory cell array having a three-dimensional (3D) vertical structure in which nonvolatile memory cells are three-dimensionally arranged, to store data received from an external host, wherein the nonvolatile memory is configured with a plurality of chips and a plurality of channels;
an SSD acceleration platform including a plurality of processing elements to perform data processing on input data provided from the nonvolatile memory or the external host by driving an application provided from the external host; and
an SSD controller including a processor, a power manager to adjust power of the SSD acceleration platform, a host interface circuit to transmit a command and data with the external host and to control a writing operation and a reading operation of the nonvolatile memory and an operation of the SSD acceleration platform based on the command, a device interface circuit to communicate with the SSD acceleration platform, and a NAND interface circuit to communicate with the nonvolatile memory,
wherein the SSD controller is configured to:
analyze a characteristic of the application and a data amount of the input data being provided to the SSD acceleration platform for the data processing,
determine an initial hardware utilization of the SSD acceleration platform based on an analysis result,
monitor the hardware utilization of the SSD acceleration platform while the SSD acceleration platform is performing the data processing, and
dynamically perform power management with respect to the SSD acceleration platform based on a monitoring result.

2. The SSD as claimed in claim 1, wherein the SSD controller is further configured to periodically or aperiodically receive information on at least one of the hardware utilization, a temperature, or a runtime from the SSD acceleration platform, and to dynamically perform the power management with respect to the SSD acceleration platform based on the received information.

3. The SSD as claimed in claim 1, wherein the SSD controller is further configured to determine, based on a result of the analysis, a number of at least some processing elements that are activated to perform the data processing among the plurality of processing elements included in the SSD acceleration platform.

4. The SSD as claimed in claim 2, wherein the SSD controller is further configured to adjust at least one of a voltage level of a driving voltage or a frequency of a clock signal based on the received information on the hardware utilization.

5. The SSD as claimed in claim 2, wherein the SSD controller is further configured to receive real-time temperature information, and dynamically adjust at least one of a voltage level of a driving voltage or a frequency of a clock signal based on the received real-time temperature information.

6. The SSD as claimed in claim 1, wherein the SSD controller is further configured to adjust at least one of a voltage level of a driving voltage of the SSD acceleration platform or a frequency of a clock signal of the SSD acceleration platform.

7. The SSD as claimed in claim 1, wherein the SSD controller is further configured to adjust a transmission rate of the input data being transmitted to the SSD acceleration platform to perform the data processing.

8. The SSD as claimed in claim 2, wherein the SSD controller is further configured to dynamically perform the power management based on the received information and management data pre-configured for the power management of the SSD acceleration platform.

9. The SSD as claimed in claim 8, wherein the management data includes at least one of a voltage scaling factor of a driving voltage and a frequency scaling factor of a clock signal, the voltage scaling factor and the frequency scaling factor being determined for each of a plurality of values regarding the hardware utilization.

10. The SSD as claimed in claim 1, wherein the SSD controller is further to receive a data processing result from the SSD acceleration platform after the data processing is finished, and to transmit the data processing result to the external host.

11. The SSD as claimed in claim 1, wherein the SSD controller is further to control the SSD acceleration platform to be in a low-power state after the data processing is finished.

12. An operating method of a solid state drive (SSD) including a nonvolatile memory including a memory cell array having a three-dimensional (3D) vertical structure in which nonvolatile memory cells are three-dimensionally arranged, to store data received from an external host, wherein the nonvolatile memory is configured with a plurality of chips and a plurality of channels, an SSD acceleration platform including a plurality of processing elements to perform data processing on input data provided from the nonvolatile memory or the external host by driving an application provided from the external host, and an SSD controller including a processor, a power manager to adjust power of the SSD acceleration platform, a host interface circuit to transmit a command and data with the external host and to control a writing operation and a reading operation of the nonvolatile memory and an operation of the SSD acceleration platform based on the command, a device interface circuit to communicate with the SSD acceleration platform, and a NAND interface circuit to communicate with the nonvolatile memory, the operating method comprising:

analyzing a characteristic of the application and a data amount of the input data being provided to the SSD acceleration platform for the data processing, determining an initial hardware utilization of the SSD acceleration platform based on an analysis result, monitoring the hardware utilization of the SSD acceleration platform while the SSD acceleration platform is performing the data processing, and dynamically performing power management with respect to the SSD acceleration platform based on a monitoring result.

13. The operating method as claimed in claim 12, further comprising:

receiving, by the SSD controller, a data processing result from the SSD acceleration platform after the data processing is finished, and transmitting, the SSD controller, the data processing result to the external host.

14. The operating method as claimed in claim 12, further comprising:

switching, by the SSD controller, the SSD acceleration platform to be in a low-power state after the data processing is finished.

15. The operating method as claimed in claim 12, further comprising:

adjusting, by the SSD controller, a transmission rate of the input data being transmitted to the SSD acceleration platform to perform the data processing.

\* \* \* \* \*